(12) United States Patent
Bakir et al.

(10) Patent No.: US 10,636,731 B2
(45) Date of Patent: *Apr. 28, 2020

(54) MECHANICALLY FLEXIBLE INTERCONNECTS, METHODS OF MAKING THE SAME, AND METHODS OF USE

(71) Applicant: Georgia Tech Research Corporation, Atlanta, GA (US)

(72) Inventors: Muhannad S. Bakir, Atlanta, GA (US); Paul Kim Jo, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/744,302

(22) PCT Filed: Jul. 14, 2016

(86) PCT No.: PCT/US2016/042236
§ 371 (c)(1),
(2) Date: Jan. 12, 2018

(87) PCT Pub. No.: WO2017/011637
PCT Pub. Date: Jan. 19, 2017

(65) Prior Publication Data
US 2019/0006271 A1    Jan. 3, 2019

Related U.S. Application Data

(63) Continuation-in-part of application No. PCT/US2016/029799, filed on Apr. 28, 2016.

(60) Provisional application No. 62/306,307, filed on Mar. 10, 2016, provisional application No. 62/255,935, filed on Nov. 16, 2015, provisional application No. 62/192,370, filed on Jul. 14, 2015.

(51) Int. Cl.
| H01L 23/498 | (2006.01) |
| H01L 21/48 | (2006.01) |
| H01L 21/71 | (2006.01) |
| H01L 23/00 | (2006.01) |

(52) U.S. Cl.
CPC .... H01L 23/49811 (2013.01); H01L 21/4853 (2013.01); H01L 21/71 (2013.01); H01L 24/16 (2013.01); *H01L 2924/01029* (2013.01)

(58) Field of Classification Search
CPC ........... H01L 23/49811; H01L 21/4846; H01L 21/4853; H01L 24/16
See application file for complete search history.

(56) References Cited

U.S. PATENT DOCUMENTS 6,268,015 B1    7/2001   Mathieu et al.
9,030,222 B2    5/2015   Eldridge et al.
(Continued)

OTHER PUBLICATIONS

European Search Report dated Feb. 21, 2019 (Application No. 16825161.9).
(Continued)

*Primary Examiner* — Thanhha S Pham
(74) *Attorney, Agent, or Firm* — Thomas | Horstemeyer, LLP

(57) ABSTRACT

Disclosed are various embodiments that involve mechanically flexible interconnects, methods of making mechanically flexible interconnects, methods of using mechanically flexible interconnects, and the like.

20 Claims, 8 Drawing Sheets

(56) References Cited

U.S. PATENT DOCUMENTS

| | | | |
|---|---|---|---|
| 2001/0020546 A1* | 9/2001 | Eldridge | B23K 20/004 174/261 |
| 2004/0022040 A1 | 2/2004 | Sitaraman et al. | |
| 2004/0184704 A1 | 9/2004 | Bakir et al. | |
| 2006/0186540 A1* | 8/2006 | Buchwalter | H01L 21/4853 257/737 |
| 2006/0211278 A1 | 9/2006 | Mathieu et al. | |
| 2007/0125486 A1 | 6/2007 | Hantschel et al. | |
| 2012/0327608 A1 | 12/2012 | Rogers et al. | |
| 2018/0294211 A1* | 10/2018 | Bakir | G01R 1/06722 |

OTHER PUBLICATIONS

Hyung Suk Yang et al., "Design, Fabrication, and Characterization of Freestanding Mechanically Flexible Interconnects Using Curved Sacrificial Layer", IEEE Transactions on Components, Packaging and Manufacturing Technology, 2:4:Apr. 1, 2012, p. 561-568.

International Search Report for PCT/US2016/042236 dated Feb. 7, 2017.

Garg, et al., "Impact of sacrificial Layer Type on Thin-Film Metal Residual Stress", Purdue e-Pubs, Purdue University, Birck and NCN Publications, Oct. 2009, pp. 1052-1055.

Smith et al., "A New Flip-Chip Technology for High-Density Packaging", Electronic Components and Technology Conference, 1996.

Ma et al., "Compliant Cantilevered Spring Interconnects for Flip-Chip Packaging", Electronic Components and Technology Conference, 2001.

Ma et al., "J-Springs—Innovative Compliant Interconnects for Next-Generation Packaging", Electronic Components and Technology Conference, 2002.

Chow et al., "Pressure Contact Micro-Springs in Small Pitch Flip-Chip Packages", IEEE Transactions on Components and Packaging Technologies, 29:4, Dec. 2006.

Chow et al., "Solder-Free Pressure Contact Micro-Springs in High-Density Flip-Chip Packages", Electronic Components and Technology Conference, 2005.

Chow et al., "Wafer-Level Packaging With Soldered Stress-Engineered Micro-Springs", IEEE Transactions on Advanced Packaging, 32:2, May 2009.

Smith et al., "Flip-chip bonding on 6-spl mu/m pitch using thin-film microspring technology", Electronic Components and Technology Conference, 1998.

\* cited by examiner

MECHANICALLY FLEXIBLE INTERCONNECTS, METHODS OF MAKING THE SAME, AND METHODS OF USE

CLAIM OF PRIORITY TO RELATED APPLICATION

This application is the 35 U.S.C. § 371 national stage application of PCT Application No. PCT/US2016/042236, filed Jul. 14, 2016, where the PCT claims priority to: PCT patent application entitled, "Vertically Curved Mechanically Flexible Interconnects, Methods of Making the Same, and Methods of Use," having ser. No. PCT/US2016/029799, filed Apr. 28, 2016; U.S. provisional application entitled, "Mechanically Flexible Electrical Interconnects with Concave/Convex Profiles for Electronic Systems," having Ser. No. 62/192,370, filed Jul. 14, 2015; U.S. provisional application entitled, "Mechanical Interconnects," having Ser. No. 62/255,935, filed Nov. 16, 2015; and U.S. provisional application entitled, "Mechanically Flexible Interconnects for Large Scale Heterogeneous System Integration," having Ser. No. 62/306,307, filed Mar. 10, 2016. Each of the above applications are entirely incorporated herein by reference.

FEDERALLY-SPONSORED RESEARCH OR DEVELOPMENT

This invention was made with Government support under contract 1620062 awarded by the National Science Foundation. The US Government has certain rights in this invention.

BACKGROUND

Stacking wafers, dies or chips, and the formation of multi-die package with dense interconnection are methods to provide increased density in an electronic system. Such three-dimensional (3D) integrated circuits and dense package interconnections can include chips manufactured via different technologies or processes, without the need to modify the manufacturing process used for each chip. Thermal and physical stresses can result at the connection points between chips in a 3D integrated circuit or dense multi-die packages. As a result, the interface used between such chips is essential to its operation. Probing and testing interfaces, which may be temporary connected to a chip or an integrated circuit, can also be subject to stresses at the connection points. Each chip in the 3D integrated circuit can also have irregularities in shape, making interconnection problematic. Specialization of interconnects can help to alleviate these issues.

SUMMARY

Disclosed are various embodiments of the present disclosure that involve mechanically flexible interconnects, methods of making mechanically flexible interconnects, methods of using mechanically flexible interconnects, and the like.

One embodiment includes a method, among others, including: forming at least one shape of photoresist on a surface of a substrate. The method also includes metallizing on the at least one shape of photoresist and the surface of the substrate to form a plurality of mechanically flexible interconnects (MFIs). The MFIs include a first MFI and a second MFI, the first MFI comprising a vertical curve that is convex to the surface of the substrate.

Another embodiment includes a substrate, among others, having: a first MFI on a surface of the substrate. The first MFI has a first geometry comprising a first height and a first thickness. A second MFI is also on the surface of the substrate. The second MFI has a second geometry comprising a second height and a second thickness. The first geometry and the second geometry are different. The first MFI and the second MFI have a substantially equivalent compliance. The first geometry comprises a vertical curve convex to the surface of the substrate.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1A:
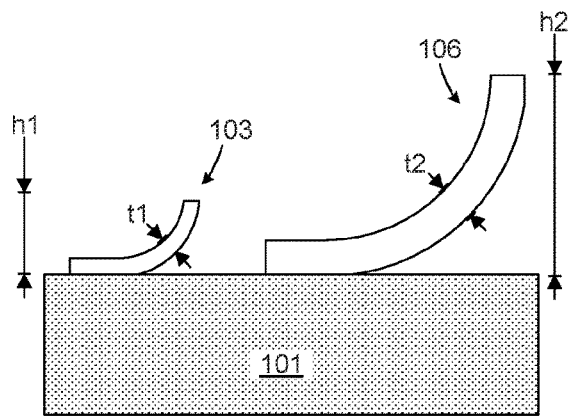
FIGS. 1A-1E illustrate cross-sectional views of mechanically flexible interconnects according to representational embodiments.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of microelectronics, electrical engineering, computer engineering, material science, mechanical engineering, and the like, which are within the skill of the art.

The following examples are put forth so as to provide those of ordinary skill in the art with a complete disclosure and description of how to perform the methods and use the probes disclosed and claimed herein. Efforts have been made to ensure accuracy with respect to numbers (e.g., amounts, temperature, etc.), but some errors and deviations should be accounted for. Unless indicated otherwise, parts are parts by volume, temperature is in ° C., and pressure is at or near atmospheric. Standard temperature and pressure are defined as 20° C. and 1 atmosphere.

Before the embodiments of the present disclosure are described in detail, it is to be understood that, unless otherwise indicated, the present disclosure is not limited to particular materials, reagents, manufacturing processes, or the like, as such can vary. It is also to be understood that the terminology used herein is for purposes of describing particular embodiments only, and is not intended to be limiting. It is also possible in the present disclosure that steps can be executed in different sequences where this is logically possible.

It must be noted that, as used in the specification and the appended claims, the singular forms "a," "an," and "the" include plural referents unless the context clearly dictates otherwise. Thus, for example, reference to "a compound" includes a plurality of compounds. In this specification and in the claims that follow, reference will be made to a number of terms that shall be defined to have the following meanings unless a contrary intention is apparent.

Processes used in integrated circuit fabrication often place a premium on uniformity of features on a substrate. Interconnects for connecting integrated circuits are often made with uniform dimensions and materials so that all interconnects will have similar properties. In order to change the properties of features, such as interconnects, industry solutions focus on changing width while keeping uniform thickness. For example, in modern industry practice a metal layer can have uniform thickness. However, in the field of mechanically deformable interconnects (mechanically flexible interconnects (MFIs)), which have applications in packaging, sockets, wafer probing, probe tips, connectors, and the like, there are advantages to having interconnects that are uniform as well as nonuniform. In the latter, when nonuniform mechanically deformable interconnects are needed, varying the width alone can be insufficient to maintain a similar mechanical compliance. One example of this is when the distance between two chips, or any surfaces with electrical interface, has a large variance, requiring interconnects of different lengths in order to make contact with different areas on the chips. In this situation, varying the width of the interconnect alone may be insufficient to maintain substantially equivalent or similar compliance.

Generally, the present disclosure relates to devices and systems incorporating MFIs, each of which can have various geometries and various materials, on the same substrate, while maintaining similar compliance in each (or can be uniform when needed). As used herein, the term substrate can refer to substrates, chips, integrated circuits, testing interfaces, wafers, dies, chips, package substrates, flexible substrates, and the like. This can overcome the need for through-silicon-vias in some 3D ICs. Moreover, often high-quality passives are needed in many electronic applications and are required to be in close proximity to the chips without monolithic integration. Methods of addressing this are also described.

Compliance is an important consideration in interconnect design. Compliance refers to how flexible a structure is. It is a measure of the deformation or deflection of an object when a certain force is applied. Compliance of a structure can be measured, for example, in meters per newton, inches per pound, or other appropriate measure. The reciprocal of compliance is stiffness, or the resistance to deformation offered by an object. An object can also have a rotational compliance, indicating the change in angle of the object when a moment is applied, which can be measured in radians per newton-meter, degrees per inch-pound, and the like.

A number of factors can affect compliance of an object, including material, geometry of the object, and other factors. Geometry of the object can affect its compliance in a number of ways. For example, a structure can deflect when a force is applied, and the deflection is related to the geometry of the structure. To best understand this, let us consider a simple uniform beam with a force applied at the tip. One way to calculate deflection of such a beam is $$\delta = \frac{F \times L^3}{3 \times E \times I} \qquad (1)$$

where F is the force applied, L is length, E is elastic modulus, and I is moment of inertia.

Generally, a structure of greater length has a greater compliance (will be more flexible), and will have an increased deflection when force is applied, and an object of lesser length will have a lesser compliance (will be more stiff).

Moment of inertia I, which appears in equation (1), can be calculated for a rectangular structure as $$I = \frac{T^3 \times W}{12} \quad (2)$$

where T is thickness and W is width. Thus geometric factors such as Length, Thickness, and Width can each affect compliance, as well as deflection of a structure when a force is applied. While equations (1) and (2) can be used to illustrate one compliance calculation for a simple structure, an object's specific geometry, such as its shape, dimensions, and connection to other objects, for example, as well as material and other factors, can further affect compliance. Complex or irregular geometries and configurations can have more complex compliance and deflection calculations.

The different lengths of the MFIs can affect compliance or stiffness, as compliance is a property related to structure or geometry of an object. As discussed above, compliance is proportional to length such that a longer object is more compliant. Thus, all other factors being equal (such as material, shape, and the like), MFIs of different lengths can have different compliance, longer MFIs being more compliant than shorter MFIs. While MFIs are often described in terms of length above, the size of an MFI can also be described by its height above the substrate upon which the MFI is formed. An MFI's height, then, can also affect compliance.

MFIs can be manufactured on a single substrate to have a different geometry, material composition, and/or pitch. MFIs can also be fabricated to have identical geometry, material composition and/or pitch. An MFI can be used as a compliant electrical interconnection between substrates, chips, dies, wafers, packages, and the like. For example, an MFI can be designed to extend from one chip to make contact with a pad on another chip. The flexible or compliant quality of the MFI allows the MFI to make effective contact with the pad at a range of distances between chips without causing undue stress, allowing for variances such as when the chips are imperfectly or irregularly shaped. While the MFIs are at times referred to as electrical interconnections, an MFI can also be used as a compliant physical interconnection among other uses. Since underfill is not required with MFIs, this can, for example, serve to reduce thermal coupling between assembled components As previously discussed, two or more substrates can be interfaced or connected in an electronic system, or a substrate can be temporarily connected to an integrated circuit for testing. To illustrate, a testing interface comprising a substrate can have a number of probes (interconnects) extending from the bottom of the substrate. To electrically connect the testing interface to an integrated circuit, the probes can be pressed against the integrated circuit, which can have contact pads on the top of the integrated circuit. Assuming that the substrate and the integrated circuit are each perfectly flat, and each probe is exactly the same length, then all of the probes will make contact with the contact pads concurrently. The forces resulting from the connection will be equally distributed on each probe of the testing interface, and the forces on the integrated circuit will also be evenly distributed at each contact pad.

However, if one of the probes is longer than the other probes, and the probes are very stiff (not compliant), then the longer probe will make contact first, and stress on the testing interface and/or the integrated circuit can result if all probes are forced to make contact with all contact pads in this situation. This is merely one way to illustrate potential stresses that can occur when connecting two substrates. Similar stresses can result, for example, if any portion of the testing interface, the probes, the contact pads, or the integrated circuit is imperfectly formed, or has minor variances, for example in size, shape, placement, composition, and the like. Mechanically flexible interconnects can help alleviate stresses caused by such imperfections or variances. In the above illustration, if the longer probe is an MFI, then at least some of the stress can be alleviated as the compliance of the longer MFI probe will allow it to flex as it makes contact with the contact pad, decreasing the stress on the integrated circuit and the testing interface.

Additionally, in the above illustration, if each of the probes of the testing interface are MFIs, they can each flex when each MFI makes contact with each corresponding contact pad of the testing interface. This would alleviate some of the stress on the integrated circuit and the testing interface as they are pressed together, even if all of the MFIs are the same length. All of the MFIs can also have similar compliance. If some of the MFIs have different compliance than other MFIs, the integrated circuit and the testing interface can be unduly stressed.

Integrated circuits, package substrates, motherboard substrates, and the like, can have irregular shapes. For example, while the substrate and the integrated circuit in the above illustration are described as being generally flat, in other situations, each may instead not be flat, causing the distance between the substrate and the integrated circuit to vary. Further, a substrate may have pads on different levels (i.e., different planes, such that a set of pads is higher than the other set). This would require MFIs of different lengths in order to make proper contact.

In another example, the top of a substrate can be flat, but a chip might be affixed to the top of the substrate such that the top of the chip is higher than the top of the substrate. If contact pads on the top of the substrate and the top of the chip are to be tested by a single, flat testing interface, MFIs (probes) extending from the testing interface can have different lengths to accommodate the contact pads on the top of the substrate and the top of the chip concurrently. In such a situation, varying the width of the MFIs alone in order to give each MFI a similar compliance may be impractical or impossible.

Geometry of an MFI can affect its compliance such that an increase in the thickness of the MFI decreases the compliance of the MFI. This application discloses multiple MFIs incorporating different geometries, such as different shapes, thicknesses, heights, widths, and multiple materials, that can be made at various pitches on the same substrate. The MFIs can be designed to have a similar compliance. MFIs utilized on a chip, substrate, and the like, can have similar compliance, which is a design characteristic that can be chosen or selected to fit a particular purpose. A first plurality of MFIs utilized together can have a first compliance for one purpose, while a second plurality of MFIs utilized together can have a second compliance for another purpose. In an embodiment, the compliance can be about 1 µm/mN to about 20 µm/mN. The principles of the present disclosure can also be applied to make MFIs that are uniform in geometries (shapes, thicknesses, heights, widths) and materials.

The MFIs can be incorporated on one or both sides of a substrate embodying a wafer, die, chip, package substrate, flexible substrate, and the like. A substrate can be made of materials such as silicon, glass, ceramic, organic, flexible polymeric, combinations thereof, or another material, and can be incorporated into an integrated circuit. A substrate can also have additional features including but not limited to bumps of various pitches and sizes, vias, optical vias, optical waveguides, optical fibers, and the like that are formed on the same substrate as the MFIs. For example, electrical or physical connections can be made with bumps of various pitches of about 5 μm to about 2,000 μm and can include a variety of solder compositions or alloys such as tin-based solder. Bumps can also include copper bonding, gold-to-gold thermo-compression bonding, polymer bonding, epoxy bonding, and the like. Conductive pillars, for example, copper pillars or columns, can also be utilized in bumps or alone.

A substrate can have a number of planes on a single side of the substrate. For example, a trench can be dug in the substrate, or the surface of a substrate can be otherwise removed creating more than one plane on a single side. MFIs on a plane or surface of the substrate can have differing lengths, heights, thicknesses and/or widths, as well as different shapes and/or geometries, and different materials. For example, MFI heights from a surface can be about 5 μm to about 200 μm, thicknesses can be about 2 μm to about 15 μm, and widths can be about 1 μm to about 100 μm. Where substrates are stacked in a 3D integrated circuit, bumps can be integrated adjacent to MFIs in order to securely hold the structure together. To this end, bumps can be used purely for mechanical function, electrical function, or both. A glue-like polymer or an epoxy can also be used locally in certain positions on the chips, for example, to hold them in place. A clamp-like mechanism can also be used. Sockets can also be used to connect chips to substrates and allow from interchangeability or replacement of chips.

Turning to the figures, FIG. 1A illustrates a cross-sectional view of an MFI 103 and an MFI 106 on a top surface of a substrate 101, according to a representational embodiment. The MFI 103 has a thickness t1 and a height h1. The MFI 103 has a vertically curved geometry that is convex with respect to the substrate. The MFI 103 has a base that is connected to the substrate 101, and a generally upward pointing tip, as a result of its vertically curved geometry that is convex with respect to the substrate. The MFI 106 has a thickness t2 and a height h2. The MFI 106 also has a vertically curved geometry that is convex with respect to the substrate, and has a base connected to the substrate 101 and an upward pointing tip.

The thickness t2 and height h2 of the MFI 106 can be different from the thickness t1 and/or the height h1 of the MFI 103, respectively. The MFI 103 and the MFI 106 can each comprise different material or materials. The different heights h1 and h2 allow the MFIs 103 and 106 to be utilized, for example, as an electrical connector to contact pads on a chip that has a non-planar (or a multi-planar) surface. Despite having different heights, the MFI 103 and the MFI 106 can have a similar compliance, as a result of their different thicknesses, different geometries, and/or their different materials among other factors. This similar compliance can minimize stress when making contact with a chip, die, wafer, etc.

While similar compliance can be achieved, compliance in each MFI can be specifically designed to fit the application of each MFI. For example, if the MFI 103 is connecting to a fragile device (for example, a MEMS device and sensor), and the MFI 106 is connecting to a more durable device, the MFI 103 can be designed to have greater compliance than the MFI 106. If the MFI 106 is connecting to the fragile device, and the MFI 103 is connecting to the durable device, the MFI 106 can be designed to have greater compliance than the MFI 103. In this way, all MFIs connecting to the fragile device can have greater compliance than those connecting to the durable device, even when having different geometries, materials, etc. The fragile device can be a MEMS and sensor, for example.

While the MFIs 103 and 106 are shown on the same side of the substrate 101, MFIs can be formed on the top surface and the bottom surface of the substrate 101. Further, the surface of a substrate can have more than one plane, for example, with more than one height when measured from the bottom surface of the substrate. MFIs can be formed with different heights, different thicknesses, different geometries and different materials on such a multi-planar substrate, chip, die, wafer, etc. In some embodiments, vias can be used to facilitate interconnections between MFIs and/or circuits on the top surface and the bottom surface of a substrate.

Figure 1C:
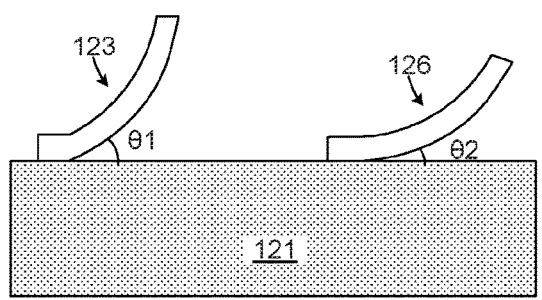
Figure 1B:
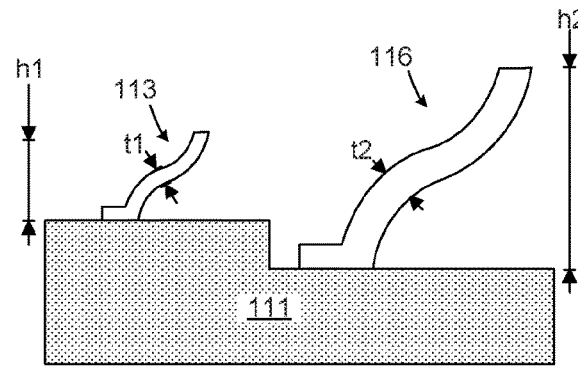

FIG. 1B illustrates a cross-sectional view of an MFI 113 and an MFI 116 each on a different plane of the top surface of a substrate 111, according to representational embodiments. The MFI 113 has thickness t1 and height h1, much like the MFI 103. The MFI 113 has two vertical curves. The MFI 113 is concave with respect to the substrate at its connection to the substrate, but is convex with respect to the substrate at its tip, which points generally upward. The MFI 116 has a thickness t2, a height h2, much like the MFI 106, but has two vertical curves, much like the MFI 113. MFIs can have similar thicknesses and heights, while having different geometries and/or materials. MFIs can also have different thicknesses and heights, while having similarly shaped geometries. In other embodiments, the parameters of each MFI, such as thickness, height, geometry, material, etc. can be different. The MFI 113 and the MFI 116 can each comprise the same or different material(s). By utilizing at least these parameters, the MFI 113 and the MFI 116 can each be designed to have a similar compliance as each other and/or a similar compliance to other MFIs on the same surface having different shapes. In addition, an MFI can have more than two vertical curves, for example, three or more vertical curves.

FIG. 1C illustrates a cross-sectional view of an MFI 123 and an MFI 126 on the top surface of a substrate 121. The MFI 123 has a vertically curved geometry that is convex with respect to the substrate, and has an angle θ1 with respect to the substrate. The MFI 126 has another vertically curved geometry that is convex with respect to the substrate, but has an angle θ2 with respect to the substrate. Thus, MFIs can be designed to have a variety of angles with respect to the substrate.

Figure 1D:
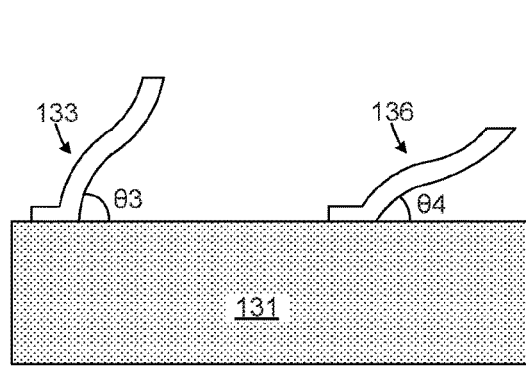

FIG. 1D illustrates a cross-sectional view of an MFI 133 and an MFI 136 on the top surface of a substrate 131. The MFI 133 has two vertical curves, and has an angle θ3 with respect to the substrate. The MFI 136 also has two vertical curves, but has an angle θ4 with respect to the substrate. Thus, MFIs can be designed with a variety of geometries, as well as a variety of angles with respect to the substrate.

Figure 1E:
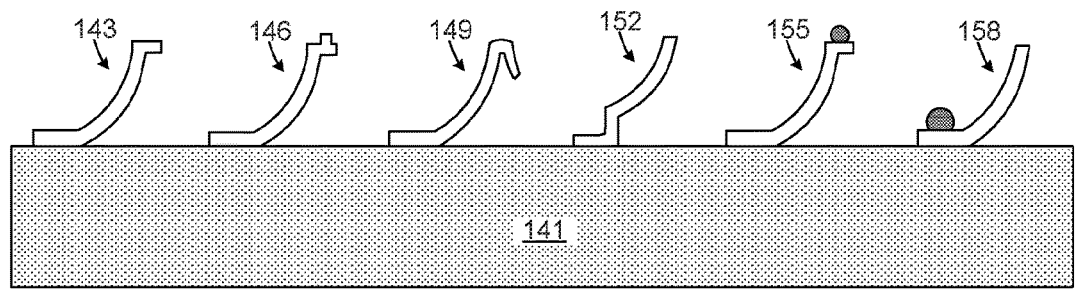

FIG. 1E illustrates a cross-sectional view of an MFI 143, an MFI 146, an MFI 149, an MFI 152, an MFI 155, and an MFI 158 on the top surface of a substrate 141. The MFIs 143, 146, 149, and 152 each show additional features that can be designed into the geometries of MFIs. For example, the MFI 143 has a vertically curved geometry convex with respect to the substrate 141. At the tip of the MFI 143, a portion of the MFI 143 extends substantially parallel to the substrate, forming a platform-like tip. The MFI 146 has a vertically curved geometry convex with respect to the substrate 141, with a platform-like portion of the MFI 146 extending substantially parallel to the substrate, much like the MFI 143. However, the MFI 146 additionally has a portion that extends upward from the platform portion. The MFI 149 has a vertically curved geometry convex with respect to the substrate 141, with a tip that comes to an upward pointing tip and then extends downward, with a hook-like appearance. The MFI 152 has a vertically curved geometry convex with respect to the substrate 141, but has a portion at the base that extends substantially vertically from the substrate 141. The MFI 155 has a vertically curved geometry convex with respect to the substrate 141, much like the MFI 143, and further incorporates a bump on the top of the MFI 155. The bump can be solder or other material as disclosed herein, and can be used as a connection to another substrate. The MFI 158 has a vertically curved geometry convex with respect to the substrate 141, and further comprises a bump on the base of the MFI 158. In other embodiments, the MFI 158 can extend to a contact pad or solder pad and the bump can be on the pad.

Different shapes or geometries can be utilized in each MFI on a circuit to fit each particular purpose local to their probing or interconnection location. For example, a geometry like the MFIs 103 can be used to make an interconnection where an upward pointing tip is desired, while the a tip such as that of the MFI 143 can be used as an interconnection where a flat contact point is desired. In other situations design constraints my guide the best shape or geometry design.

Thus MFIs can be made with a variety of geometries, including different shapes, overall lengths, heights from a substrate, thicknesses, and angles with respect to the surface of the substrate, etc. In an embodiment, the MFI height from a surface can be about 5 µm to about 200 µm. In an embodiment, the MFI can have a thickness of about 2 µm to about 15 µm. In an embodiment, the MFI can have a width of about 1 µm to about 100 µm. The variety of geometries can be made, for example, by forming each MFI on the surface of a corresponding shape of photoresist on a substrate. The various corresponding photoresist shapes can be formed, for example, by photolithography, reflowing, 3D printing, injection molding, stamping, or other techniques.

Figure 2A:
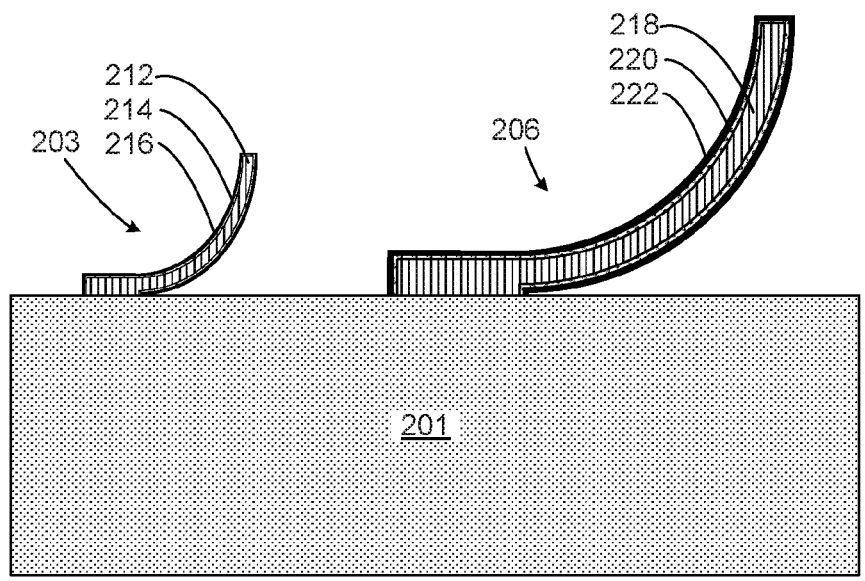
FIGS. 2A and 2B illustrate cross-sectional views of mechanically flexible interconnects having multiple materials according to representational embodiments.

FIG. 2A illustrates a cross-sectional view of a substrate 201 with an MFI 203 and an MFI 206 on the surface of the substrate 201. Each of the MFIs 203 and 206 have three layers. As used herein, a layer can be a few molecular layers to about 15 µm thick, and can completely or partially cover a surface, and can have an evenly or unevenly distributed thickness. The MFI 203 has a core layer 212, a first outer layer 214, and a second outer layer 216. Each of the layers 212, 214, and 216 can be different materials, or in other embodiments two or more layers can be layers of the same material. Other embodiments can have more layers or fewer layers. The core layer 212 can, for example, be made by electroplating on a seed layer on the surface of the substrate 201 and the surface of a curved shape of photoresist. In one situation, the core layer 212 can be chosen to have a high electrical conductivity, such as copper, beryllium copper, etc. In some examples, materials with high electrical conductivity may have a low yield strength and high compliance. In other embodiments, the core layer may not be selected for its conductivity, and may be selected for other properties. In an embodiment, each layer can have a thickness of about 2 µm to about 15 µm.

The first outer layer 214 envelops the core layer 212. The first outer layer 214 can be made by electroplating over the core layer 212 while nothing is under the core layer 212. For example, after the photoresist upon which the core layer 212 was formed is removed. In one embodiment, the layer 214 can be chosen to have a higher yield strength, a lower compliance, or both. One example of a high yield strength material is NiW. In other embodiments, the material of the first outer layer can be selected for other properties.

The second outer layer 216 envelops the first outer layer 214, and can be made via electroplating, passivation, or other techniques. The material of the second outer layer 216 can be chosen for its properties. There may also be additional layers of additional materials on the MFI 203. Each layer in the MFI 203 can be made via electroplating, passivation, or other process, and each layer can have a different thickness. In some situations, the outermost layer of an MFI can be gold or other conductive, non-corrosive material. In other embodiments, the outermost layer can be selected for other properties.

Much like the MFI 203, the MFI 206 is made of a core layer 218, a first outer layer 220, and a second outer layer 222. In one embodiment, each of the layers 218, 220, and 222 can be different materials. In other embodiments two or more of the layers may be layers of the same material. The core layer 218 of the MFI 206 is shown as having the same material but a different thickness from the core layer 212 of the MFI 203. In other embodiments, they may have the same or different material and thickness. The first outer layer 220 envelops the core layer 218 of the MFI 206. The first outer layer 220 is shown as the same material as the first outer layer 214 of the MFI 203, but having a different thickness. In other embodiments they may be different materials and/or have the same thickness. The second outer layer 222 envelops the first outer layer 220. As shown, the second outer layer 222 of the MFI 206 is the same material and same thickness as the second outer layer 216 of the MFI 203, but in other embodiments each can have different materials and thicknesses.

There may also be additional layers of additional materials on the MFI 206, each layer having its own thickness. This can be achieved, for example, by metallizing a layer of one MFI while the other MFI is protected, for example, by covering it with a layer of photoresist. The MFIs 203 and 206 can, in other embodiments, have a layer of the same material formed on each concurrently by leaving both exposed for metallization. While the MFIs 203 and 206 have similar shapes, MFIs of different shapes can be formed using a similar process, for example, by utilizing different corresponding shapes of photoresist.

Figure 2B:
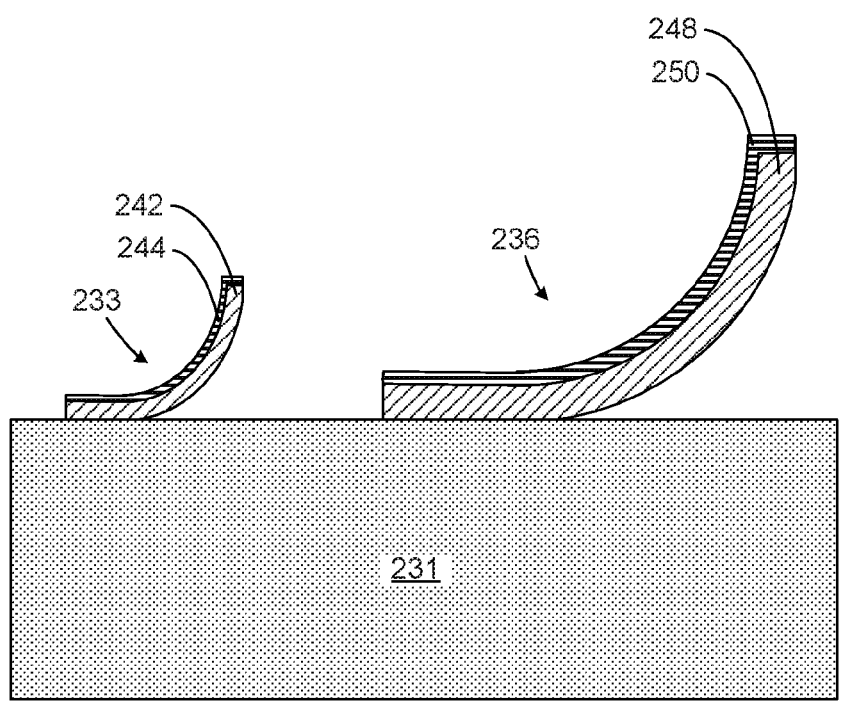

Moving to FIG. 2B, illustrated is a cross-sectional view of a substrate 231 with an MFI 233 and an MFI 236 formed on its surface. The MFIs 233 and 236 each have two layers. The MFI 231 has a core layer 242 and an outer layer 244. The MFI 236 has a core layer 248, and an outer layer 250. Each layer in the MFIs 233 and 236 can have its own material and its own thickness. In an embodiment, each layer can have a thickness of about 2 µm to about 15 µm.

In one example, the MFI 233 can be made by electroplating the core layer 244 on a seed layer on the surface of a corresponding shape of photoresist. In one embodiment, at least a portion of the core layer 248 of the MFI 236 can be formed concurrently with the core layer 244 of the MFI 233. In one embodiment as shown, the core layers 244 and 248 of the respective MFIs have different thicknesses. In this embodiment, the core layers 244 and 248 can be electroplated concurrently for a duration of time, then the MFI 233 can be covered, for example with a spray coating of photoresist. While the MFI 233 is covered, the thickness of the MFI 248 can be increased by electroplating for a second duration. In another embodiment, if the thicknesses of the layers 244 and 248 are substantially similar, this can be achieved by electroplating each concurrently for the same duration.

The outer layer 244 of the MFI 233 can be made by electroplating the core layer 242 while the corresponding shape of photoresist remains under the core layer 242, completing the MFI 233. The outer layer 250 of the MFI 236 can be made by electroplating on the core layer 248 while the corresponding shape of photoresist remains under the core layer 248. The outer layers 244 and 250 can be formed concurrently with the same material and/or duration. Alternatively, the outer layers 244 and 250 can be formed separately, for example, by covering one MFI with a layer of photoresist while a layer is formed on the other, exposed MFI. While the MFIs 233 and 236 have similar shapes, MFIs of different shapes can be formed using a similar process, for example, by utilizing different corresponding shapes of photoresist.

FIGS. 2A and 2B illustrate that MFIs of various shapes and sizes can have multiple materials, and can be formed such that the materials are distributed in different ways. For example, each layer of the MFIs 203 and 206 envelops the previous layer, while each layer of the MFIs 233 and 236 is formed on top of the previous layer. A combination of each type of material distribution can be achieved, for example, by removing the corresponding shape of photoresist under the MFI 236, and electroplating to fully envelop the layers 248 and 250 of the MFI 236 with an additional outer layer. MFIs can also have other distributions of materials. While the principles discussed with reference to FIGS. 2A and 2B mentions MFIs specifically, this multi-material fabrication can be used for passive circuit components as well, including inductors, antennas, and other passive circuit components. In addition, these principles can be applied, for example, to form MFIs, and inductors on a substrate, each comprising different material(s).

Figure 3A:
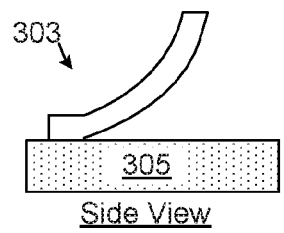
FIG. 3A illustrates a cross-sectional view of a mechanically flexible interconnect according to various embodiments.

FIG. 3A illustrates a side view of an MFI 303 formed on a substrate 305. The MFI 303 has a vertically curved cross section that is convex with respect to the substrate. The MFI 303 can be made, for example, by electroplating on a corresponding shape of photoresist. Such a shape of photoresist can be formed in a number of ways such as reflowing a shape of photoresist made by exposure and development, placing a dot of photoresist on the surface of a substrate, injection molding, surface wetting chemistries to control reflow, 3D printing, stamping, or other techniques.

Figure 3E:
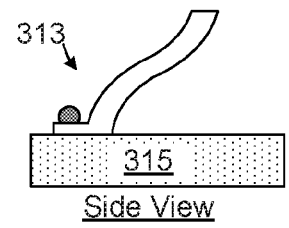
FIG. 3E illustrates a cross-sectional view of another mechanically flexible interconnect according to various embodiments.
Figure 3B:
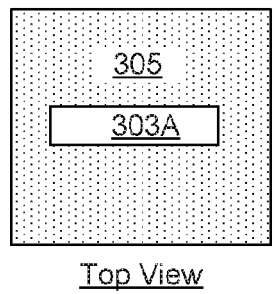
FIGS. 3B-3D illustrate top views corresponding to the cross-sectional view of the mechanically flexible interconnect of FIG. 3A according to various embodiments.

FIG. 3B illustrates one example of a possible top view of the MFI 303 of FIG. 3A. An MFI 303A having a rectangular top view is shown on the substrate 305.

Figure 3F:
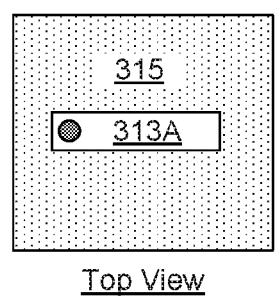
FIGS. 3F-3H illustrate a number of top views corresponding to the cross-sectional view of FIG. 3E according to various embodiments.
Figure 3C:
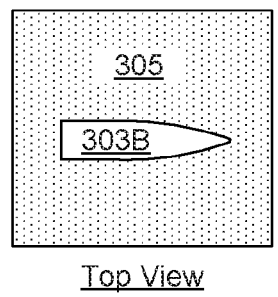

FIG. 3C illustrates another example of a possible top view of the MFI 303 of FIG. 3A. An MFI 303B having a sharp or pointed tip is shown on the substrate 305. Accordingly, MFIs having a similar side view can be made with a variety of geometries as seen from the top view. The different top views affect the geometry of the MFIs and can result in differing compliance even when the cross sectional view of each MFI appears similar.

Figure 3G:
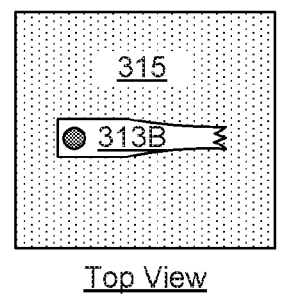
Figure 3D:
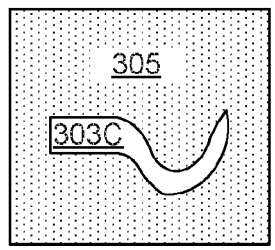

FIG. 3D illustrates yet another example of a possible top view of the MFI 303 of FIG. 3A. An MFI 303C having a hook like, curved top view is shown on the substrate 305. Additional shapes can also be formed, including other curved or angular shapes as seen from the top view. The various top views can be formed, for example, by exposing photoresist using a mask corresponding to the desired shape, or by injection molding, surface wetting chemistries to control reflow, 3D printing, stamping, or other techniques.

FIG. 3E illustrates a side view of an MFI 313 formed on a substrate 315. The MFI 313 has two vertical curves, and can be made, for example, by electroplating on a corresponding shape of photoresist that is formed using techniques that will be discussed. A bump is formed at the base of the MFI 313.

FIG. 3F illustrates one example of a possible top view of the MFI 313 of FIG. 3E. An MFI 313A having a rectangular top view is shown on the substrate 315. The bump can also be seen at the base of the MFI 313A. This top view is similar to that of the MFI 303A of FIG. 3B, showing that MFIs with similar top views can have different side views, and thus different geometries that can affect the compliance of each. The MFIs 303A and 313A can still have similar compliance, for example, by the design of the geometry of each MFI, the material composition of each MFI, or other factors of each MFI.

FIG. 3G illustrates another example of a possible top view of the MFI 313 of FIG. 3E. An MFI 313B having a three-pronged tip is shown on the substrate 315. The bump can also be seen at the base of the MFI 313B. MFIs can be designed to have more or fewer tips, which can affect scratching when used as a probe, or other attributes of the MFI.

Figure 3H:
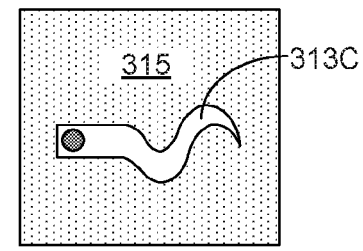

FIG. 3H illustrates yet another example of a possible top view of the MFI 313 of FIG. 3E. An MFI 313C having two curves when viewed from the top view is shown on the substrate 315. The bump can also be seen at the base of the MFI 313C. MFIs having three or more curves when viewed from the top view can also be formed.

Further MFIs can be formed having a wide variety of geometries with different side views and top views. In some embodiments, an MFI can have a multi-pronged tip, or can have more than one connection point with the substrate, among other potential geometries. Similar fabrication techniques can be used to concurrently form raised passive circuit components such as capacitors, inductors, and antennas, among other circuit elements, alongside MFIs.

Figure 4A:
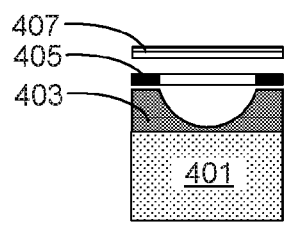
FIGS. 4A-4D illustrate steps to create a mechanically flexible interconnect according to various embodiments.

FIGS. 4A-4H illustrate a number of principles that can be used in a variety of ways to create MFIs with different geometries. FIG. 4A shows a cross-sectional view of a substrate 401. The substrate 401 has photoresist 403 on its surface. The photoresist 403 has an indented curved surface. This can be achieved, for example, by utilizing a mask 405 and a light diffuser 407 in conjunction with a light source to expose the photoresist 403 to a pattern of light. The diffuser 407 causes the photoresist 403 that is under the center of a pattern in the mask 405 to be exposed with greater light intensity than the photoresist towards the sides of the pattern, resulting in an indented curved surface in the photoresist 403.

Figure 4E:
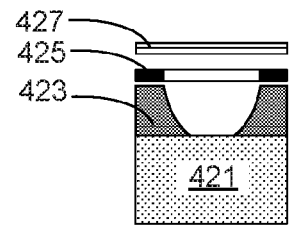
FIGS. 4E-4I illustrate steps to create multiple mechanically flexible interconnects according to various embodiments.
Figure 4B:
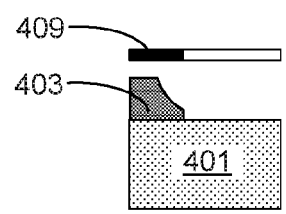

FIG. 4B shows another mask 409, which is utilized in conjunction with a light source to expose the photoresist and, after development, leave the photoresist 403 as shown. At this point, a metallization seed layer can be formed on the surface of the substrate 401 and the surface of the photoresist 403.

Figure 4F:
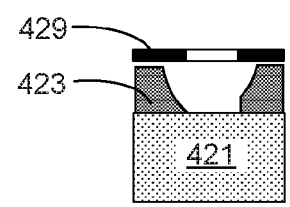
Figure 4C:
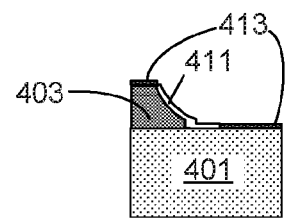

FIG. 4C shows an MFI 411 formed on the surface of the substrate 401 and a portion of the surface of the photoresist 403. Another layer of photoresist 413, for example formed by a spray coating, is applied over the surface of the substrate 401 and the photoresist 403, exposed to a pattern of light and developed. Since the photoresist 413 covers the metallization seed layer, when metallization is performed, metal is formed in the shape of the MFI 411. Additional layers can be metallized without removing the photoresist, resulting in a distribution of materials similar to that of FIG. 2B.

Looking back to FIG. 4B, note that exposing the curved portion of the photoresist 403 to a pattern of light can result a sharper cutoff, resulting in a substantially vertical section in the MFI 411 between its base and its vertically curved section. In this embodiment, the substantially vertical section of the MFI 411 is not very high as compared to the vertically curved section. In other embodiments, the substantially vertical section can be comparably larger or smaller, or removed.

Figure 4G:
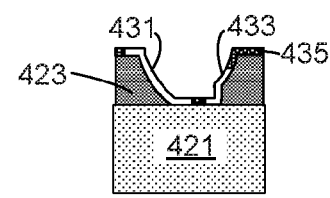
Figure 4D:
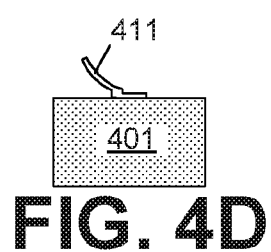

FIG. 4D shows the MFI 411 on the surface of the substrate 401 with all photoresist removed. Additional layers can be metallized at this point to result in a distribution of materials similar to that of FIG. 2A.

FIG. 4E shows a cross-sectional view of a substrate 421 with photoresist 423 on its surface. A mask 425 and a diffuser 427 are utilized in conjunction with a light source to expose and develop the photoresist to result in the curved shaped indent in the photoresist 423. In this embodiment, the exposure and development results in removal of all of the photoresist towards the center of the pattern of the mask 425. This can be a result of longer exposure as compared to that in FIG. 4A, a difference in the light source, and/or a difference between the diffuser 407 and the diffuser 427, among other factors.

FIG. 4F shows the photoresist 423, which has been further exposed and developed by using a mask 429. On the left side, the photoresist 423 has a continuous curve from the top down to the surface of the substrate 421. On the right side, the curve of the photoresist 423 has been cut off by exposure using the mask 429 and development. In some embodiments a metallization layer is formed on the surface of the substrate 421 and the photoresist 423 at this point.

FIG. 4G shows an MFI 431 and an MFI 433 formed, for example, by metallization on the surface of the substrate 421 and the photoresist 423. A spray coat of photoresist 435 can be applied, then exposed to a pattern of light using a mask, and developed to leave the photoresist 435 as shown. By this process, the shapes and positions of the MFIs 431 and 433 can be designed. For example, the MFIs 431 and 433 each have a horizontal section at the tip that can be formed by the shape of the photoresist 435, which allows the MFIs 431 and 433 to be formed along the top surface of the photoresist 423. Note also that the vertical cutoff in the curve of the right side of the photoresist 423 results in the vertical section of the MFI 433. In further embodiments, solder can be fabricated at the top of the MFIs at this stage, if desired.

Figure 4H:
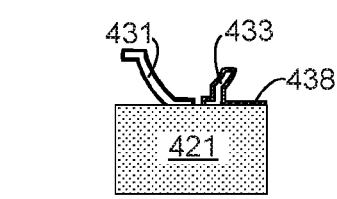
Figure 4I:
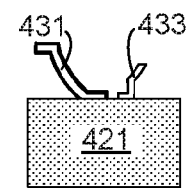

FIG. 4H shows the MFI 431 and the MFI 433 on the surface of the substrate 421. The MFI 431 has a second layer enveloping its first layer, while the MFI 433 still has only its initial layer. To achieve this, the photoresist 423 has been removed, and photoresist 438 has been applied over the MFI 433. Thereafter, the second layer of the MFI 431 is formed, for example by metallization, of the MFI 431 while the MFI 433 remains covered by the photoresist 423. The second layer of the MFI 431 is a different material than its first layer. In other embodiments, the same material can be used. FIG. 4I shows the MFIs 431 and 433 on the surface of the substrate 421 with all photoresist removed. The MFIs 431 and 433 each have different geometries including different heights, thicknesses, shapes, features, and materials. The MFIs 431 and 433 can also have different shapes from a top view, including different widths.

Figure 5A:
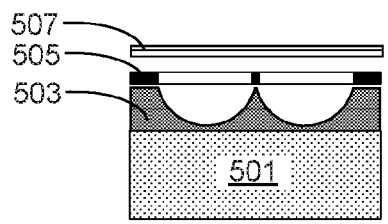
FIGS. 5A-5D illustrate steps to create a mechanically flexible interconnect according to various embodiments.

FIGS. 5A-5D illustrate a number of principles that can be used in a number of different ways to produce MFIs with different geometries. FIG. 5A shows a substrate 501 with photoresist 503 on its surface. The curved indents in the photoresist 503 can be made using the previously discussed techniques, this time using a mask 505 and diffuser 507 when exposing the photoresist 503 to a pattern of light and developing.

Figure 5B:
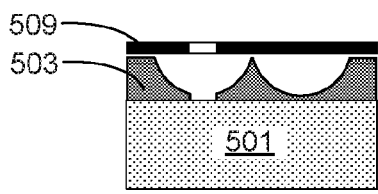
Figure 5C:
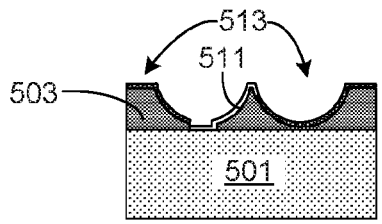
Figure 5D:
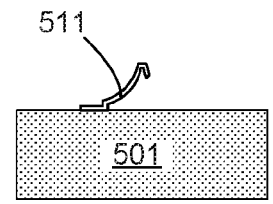

FIG. 5B shows the result of development after another exposure using a mask 509. A metallization seed layer can be formed on the surface of the substrate 501 and the photoresist 503. FIG. 5C shows a spray coat of photoresist 513 that has been exposed to a pattern of light and developed. In this embodiment, the pattern allows the MFI 511 to be formed such that it extends from the left indent to a peak between the left and right indents, and sloping downward into the right indent. This produces the hook-like portion of the MFI 511, much like the hook-like downward sloping portion of the MFI 149 of FIG. 1E. FIG. 5D shows the MFI 511 on the substrate 501 with all photoresist removed.

Figure 6A:
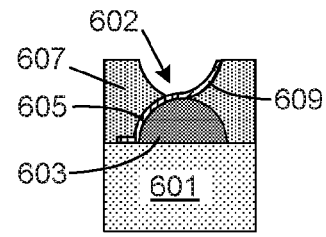
FIGS. 6A-6B illustrate steps to create another mechanically flexible interconnect according to various embodiments.
Figure 6B:
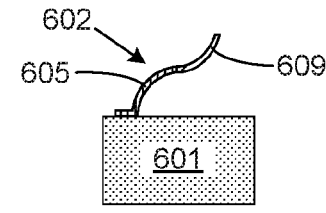
Figure 6C:
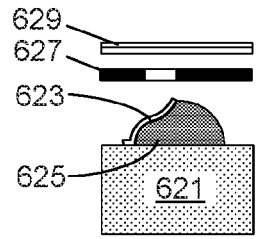
FIGS. 6C-6D illustrate steps to create yet another mechanically flexible interconnect according to various embodiments.
Figure 6D:
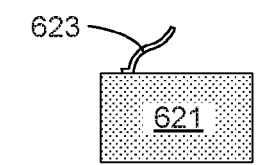

FIGS. 6A-6D illustrate a number of principles that can be used in a number of different ways to produce MFIs with different geometries. For example, FIGS. 6A and 6B illustrate one way to produce MFIs with multiple vertical curves, and FIGS. 6C and 6D illustrate another way to produce MFIs with multiple vertical curves.

FIG. 6A shows a substrate 601 and an MFI 602. A mound of photoresist 603 is formed on the surface of the substrate 601. The mound of photoresist 603 can be formed by reflowing a shape of photoresist, injection molding, stamping, 3D printing, or other techniques. A first vertically curved section 605 of the MFI 602 is formed on the mound of photoresist 603, for example, by metallization. The first vertically curved section 605 is concave with respect to the substrate 601.

After the first vertically curved portion 605 is formed, photoresist can be applied, for example, by spin coating or other techniques. Thereafter, an indent can be formed using a mask and diffuser as discussed earlier, resulting in the photoresist 607 as shown. The indent in the photoresist can expose some of the first vertically curved section 605. Metallization techniques can be used to form a second vertically curved section 609, such that the MFI 602 has two vertically curved sections 605 and 609. The second vertically curved section 609 is convex with respect to the substrate.

FIG. 6B shows the MFI 602 on the substrate 601 after all photoresist is removed. The MFI 602 has a first vertically curved section 605 concave to the substrate 601 and a second vertically curved section that is convex to the substrate 601. Similar techniques can be used to make additional straight or curved sections.

FIG. 6C shows a substrate 621 and an MFI 623. The MFI 623 is formed on the surface of a mound of photoresist 625. The mound of photoresist 625 can be formed much like the mound of photoresist 603 of FIG. 6A. The mound of photoresist 625 has an indent in its surface. This indent can be produced by exposing the mound 625 to a pattern of light using a mask 627 and a diffuser 629, and developing thereafter. Once the indent is produced, the MFI 623 can be formed by metallization as discussed earlier.

FIG. 6D shows the MFI 623 on the substrate 621 with all photoresist removed. The MFI 623 has a first vertical curve that is concave to the substrate 621, and a second vertical curve that is convex to the substrate 621, much like the MFI 602 of FIG. 6B. However, the MFI 623 is formed as a single section rather than in multiple sections like the MFI 602. In other embodiments, additional curved or straight sections can also be produced. For example, a downward curve can be produced by metallizing further to the right along the surface of the mound 625 in FIG. 6C. A straight vertical section can be produced by exposing the left side of the mound 625 to a pattern of light using a mask without a diffuser. Three vertical curves can be produced by shifting the pattern in the mask 627 to the left. More complex masks can be utilized to produce additional indents and resulting in additional vertical curves or more complex MFIs.

Figure 7A:
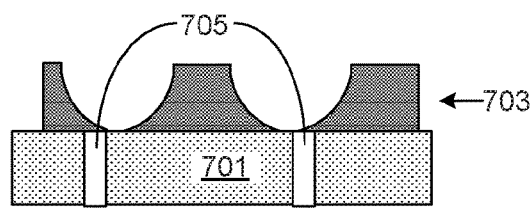
FIGS. 7A-7E illustrate steps to create elevated passive elements according to various embodiments.

FIGS. 7A-7D illustrate a number of principles that can be used in a number of different ways to produce elevated passive circuit components alongside MFIs or on top of MFIs. Elevating the passive circuit components away from the substrate (whether semiconductor, organic, chip, die, or other type of substrate) can serve to isolate the components from other circuit components, reduce parasitics, achieve performance benefits, reduce losses and increase quality (Q) factors. FIG. 7A shows a cross-sectional view of a substrate 701 with photoresist 703 on its surface. The photoresist 703 has two indents. The indents can be made by exposing photoresist using a mask and diffuser and developing as discussed earlier. Two vias 705 extend through the substrate 701. While this embodiment utilizes the vias 705, in other embodiments, vias may not be used. In some embodiments, the passive circuit components can have circuit pathways on the surface of the substrate 701.

Figure 7B:
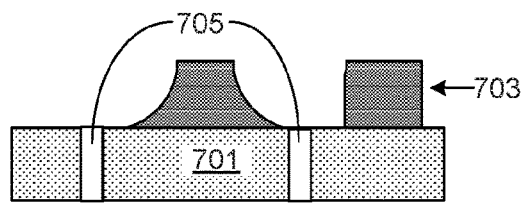

FIG. 7B shows a cross-sectional view of the photoresist 703 on the surface of the substrate 701. A portion of the photoresist 703 has been removed, exposing the vias 705 that were previously covered by photoresist. In other embodiments, the indents can be large enough to expose the vias 705. The portion of the photoresist can be removed for example by photolithographic or other techniques as discussed. At this point, a metallization seed layer can be formed or implanted on the substrate 701, the photoresist 703 and the vias 705.

Figure 7C:
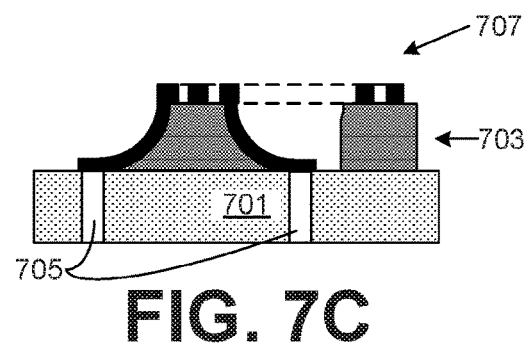

FIG. 7C shows an elevated inductor 707 formed on the surface of the substrate 701 and the photoresist 703. The shape of the inductor can be designed as discussed previously regarding MFIs. A layer of photoresist can be applied over the metallization seed layer, and a pattern can be applied through photolithographic processes or other techniques, allowing passive circuit components, such as the inductor 707, to be designed by exposing certain areas to metallization. Metallization of passive circuit components can include any number of materials and metals. For example, copper can be formed by electroplating, or gold can be passivated to form the desired components. In further embodiments, other materials can be used. Here, the inductor would not encounter any mechanical deformation since it will never make contact to the substrate once bonded.

The shape of the inductor 707 shown here becomes clearer through the top views discussed below. In this embodiment, the inductor can be electrically connected to other circuit elements using the vias 705. In other embodiments electrical connections can be formed, for example, on the top surface of the substrate 701 before the photoresist 703 is applied and the inductor 707 is formed on the photoresist 703 and the substrate 701.

Figure 7D:
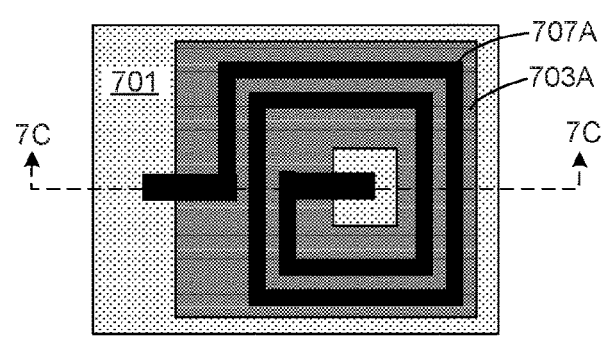

FIG. 7D illustrates one possible top view of the inductor 707 of FIG. 7C, with the location of the cross-sectional view 7C being indicated. A top view of the substrate 701 is shown, having photoresist 703A and an inductor 707A on its surface. The photoresist 703A is one possible top view of the photoresist 703 of FIG. 7C. The inductor 707A is one possible top view of the inductor 707 of FIG. 7C. The inductor 707A is formed on the surface of the photoresist 703A. The shape of the inductor 707A can be designed much like discussed earlier regarding MFIs, by forming a layer of photoresist over the metallization seed layer, exposing the seed layer in the designed area of the inductor as shown through lithographic processes, and metallization of the exposed seed layer. The shape of the inductor 707A from the top view is angular, with the appearance of a squared-off spiral.

Figure 7E:
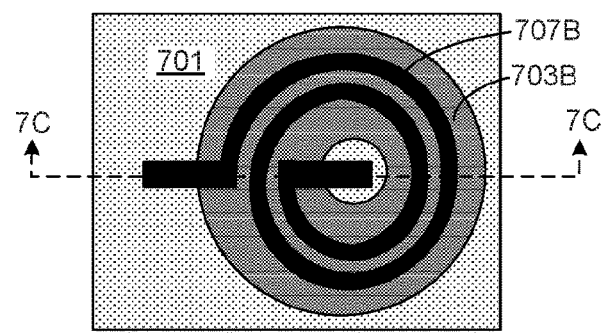

FIG. 7E illustrates another possible top view of the inductor 707 of FIG. 7C, with the location of the cross-sectional view 7C being indicated. A top view of the substrate 701 is shown, having photoresist 703B and an inductor 707B on its surface. The photoresist 703B is another possible top view of the photoresist 703 of FIG. 7C. The inductor 707B is another possible top view of the inductor 707 of FIG. 7C. The inductor 707B is formed on the surface of the photoresist 703B. The shape of the inductor 707B can be designed as discussed above. The shape of the inductor 707B from the top view is substantially a spiral shape. Additional shapes are also possible incorporating curved or angular sections. While FIGS. 7A-7D illustrate elevated inductors, other elevated passive circuit components such as capacitors, antennas and other elements can be produced using the principles described. The elevation above the substrate can increase the quality of the passive circuit components, for example, by reducing parasitics and heat by proving a gap between the passive circuit components and the substrate.

Figure 8A:
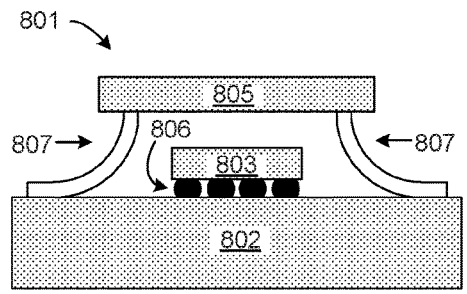
FIGS. 8A-8F illustrate cross-sectional views of integrated circuits incorporating mechanically flexible interconnects according to various embodiments.

FIG. 8A illustrates an integrated circuit microsystem 801 incorporating MFIs. A substrate 802 is connected to a first chip 803 and a second chip 805. The first chip 803 is connected to the substrate 802 using bumps 806. In other embodiments, MFIs could be used instead of the bumps 806. The second chip 805 is positioned elevated above the first chip 803, without being directly connected to the first chip 803. The second chip 805 is elevated using MFIs 807, which are used to connect the substrate 802 to the second chip 805.

Figure 8B:
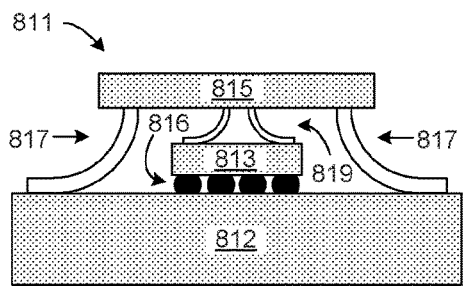

FIG. 8B illustrates an integrated circuit microsystem 811 incorporating MFIs. A substrate 812 is connected to a first chip 813 and a second chip 815. The first chip 813 is connected to the substrate 812 using bumps 816. In other embodiments, MFIs could be used instead of the bumps 816. The second chip 815 is positioned elevated above the first chip 813. The second chip 815 connected to the substrate 812 using MFIs 817. MFIs 819 are utilized to connect the second chip 815 to the first chip 813. The MFIs 819 are smaller than the MFIs 817, but can be designed to have similar compliance using the principles disclosed herein. In one embodiment, the MFIs 817 can be formed on the substrate 812, while the MFIs 819 are formed on the first chip 813, and the integrated circuit 811 can be assembled. In another embodiment, the MFIs 817 and 819 can all be formed on the second chip 815 and later assembled into the integrated circuit 811. Other processes are also possible using the principles disclosed herein.

Figure 8C:
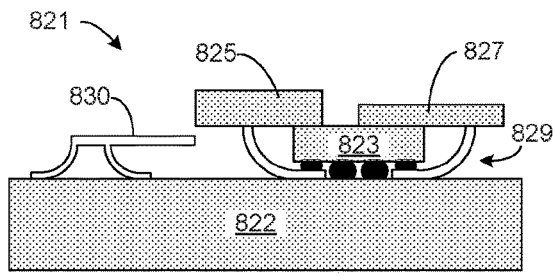

FIG. 8C illustrates an integrated circuit microsystem 821 incorporating MFIs and elevated circuit elements. A substrate 822 is connected to a chip 823, which is connected to a sensor 825 and a sensor 827 the sensors 825 and 827 can be MEMS or other sensors, or can be other types of chips. The sensors 825 and 827 are each supported partly (or almost fully) by the top surface of the chip 823, and partly using the MFIs 829. In some embodiments, the sensors 825 and 827 can be affixed to the top surface of the chip 823 using glue, epoxy, solder, etc., for a physical connection. In other embodiments, the connection between the chip 823 and the sensors 825 and 827 can include an electrical connection. Sensors 825 and 827 can be almost fully supported by chip 823 and can have an edge or surface positioned to allow for electrical or other connection to the sensors 825 and 827 via the MFIs 829.

Such an arrangement can be used, for example, to save space in the integrated circuit 821. In some embodiments, this arrangement can be used to minimize power or parasitics by minimizing the adjacent area between the sensors and the chip 823 and/or providing a gap between the sensor 825 and 827 and the substrate 822. Note also that the bumps connected the substrate 822 with the chip 823, but the MFIs 829 are under or extend from the pads of at least some of the bumps, acting much like contact pads. In other embodiments, the MFIs can extend from contact pads or solder pads.

An elevated inductor 830 is shown connected to the substrate 822 adjacent to the chip 823 and the sensors 825 and 827. Other elevated passive circuit components can be produced using the principles disclosed herein. The elevated inductor 830 can be produced concurrently with the MFIs 829, using similar techniques for each, as described herein with reference to MFIs and of different metals (for example, the inductor can be mostly copper, and the MFI can be mostly NiW). In other embodiments they can be produced separately, and can comprise other materials.

Figure 8D:
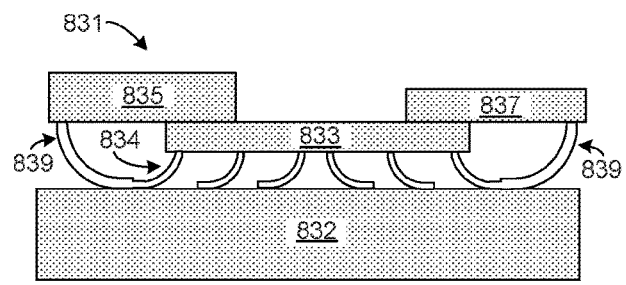

FIG. 8D illustrates an integrated circuit microsystem 831 incorporating MFIs. The configuration of the integrated circuit 831 can be referred to as a bridge chip configuration. A substrate 832 is connected to a bridge chip 833 using MFIs 834. In other embodiments, bumps (for example, solder bumps) can be used, or a combination of MFIs and bumps, or wire bonding can be used. A first chip 835 and a second chip 837 are connected to the top of the chip 833. In other embodiments, the chips 835 and 837 can each be sensors, or another package substrate, etc. Where the chips 835 and 837 are sensors, they can be MEMS sensors, optical sensors, electrical sensors, or other types of sensors. In this embodiment, the connection of the sensors 835 and 837 to the bridge chip 833 can be a physical connection, for example using glue, epoxy, solder, etc., to make a physical connection. In other embodiments the connection can include electrical connections using MFIs, bumps, or a combination of MFIs and bumps. The sensors 835 and 837 are connected to the substrate 832 using MFIs 839. The MFIs 839 are larger than the MFIs 834, having a greater height above the substrate 832 in order to connect to the sensors 835 and 837 above the bridge chip 833. In further embodiments, the MFIs 839, though larger than the MFIs 834, can be bumps, or a combination of MFIs and bumps.

Thus, FIG. 8D illustrates that many embodiments of bridge configurations are possible using the principles of this disclosure. For example, the connections between the substrate 832 and the bridge chip 833 can be MFIs, bumps, or a combination of MFIs and bumps, or a physical connection using glue, epoxy, solder, etc. The connections between the substrate 832 and each of chips 835 and 837 can be MFIs, bumps, or a combination of MFIs and bumps, or a purely physical connection. The connections between the bridge chip 833 and each of chips 835 and 837 can be MFIs, bumps, or a combination of MFIs and bumps, or a purely physical connection.

Note that at least some of the smaller MFIs 834 share a common anchor point with at least some of the MFIs 839. This illustrates that a single anchor point can be used by multiple MFIs having different geometries. The MFIs 834 and 839 can be designed to have similar compliance using the principles disclosed herein.

Figure 8E:
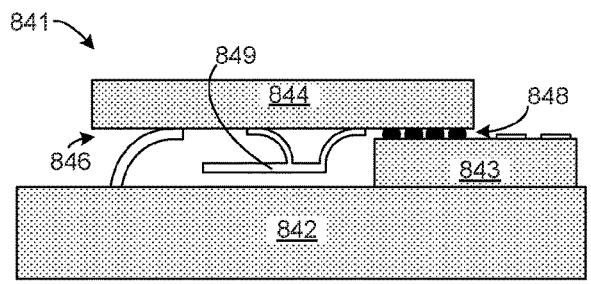

FIG. 8E illustrates an integrated circuit microsystem 841 incorporating MFIs. A substrate 842 has a chip 843 on its surface. A chip 844 is connected to the substrate 842 and the chip 843 using the MFI 846 and solder microbumps 848, respectively. The MFI 846 can, for example, be made on the surface of the chip 844 for connecting to the substrate 842 and the chip 843. The MFI 846 is convex to the surface of the chip 844. In further embodiments, the MFI 846 as shown can be made on the surface of the substrate 842, concave to the surface of the substrate 842. The chip 843 is partly under the chip 844 and partly exposed, allowing connectivity to the chip 843 via pads on the surface of the chip 843. An elevated inductor 849 is formed on the surface of the chip 844. Other elevated passive circuit components can be produced using the principles disclosed herein. The microbumps 848 allow for very tight interconnect densities when needed between chip 844 and chip 843. The microbumps 848 can also be referred to as fine-pitch bumps, and can, for example be made of solder or other appropriate material. The microbumps 848 can be replaced with MFIs, for example, to reduce thermal coupling. MFIs 846 can be replaced with bumps when desired, to yield an elevated and isolated inductor alongside solder attachments.

Figure 8F:
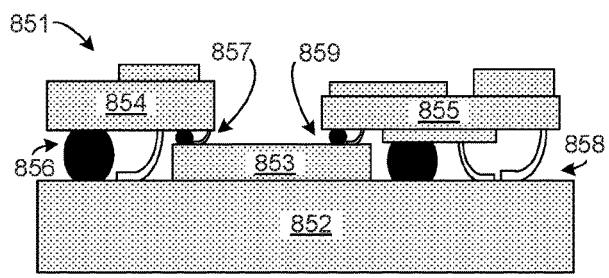

FIG. 8F illustrates an integrated circuit microsystem 851 incorporating MFIs. The integrated circuit microsystem 851 can be considered another bridge chip like configuration. A substrate 852 has a bridge chip 853 connected to its surface. Although we refer to 853 as a bridge chip, note that 853 can be a simple high-density wiring package substrate (ceramic, glass, organic, ribbon, or silicon or other). In this embodiment, the substrate can be a printed wiring board (PWB); connections between the substrate 852 and the bridge chip 853 can be via wire bonding, or other connections as discussed, if needed. Bridge chip 853 can be passive and only contain fine pitch wires and passives (inductors, capacitors, and antennas) or it can have circuitry on it. The PWB can include electrical interconnects. The bridge chip 853 can be an optical chip (and contain light-source, detector, or modulator) and a fiber optic cable can be connected to it. The bridge chip 853 can be used as a bridge between a multi-chip package 854 and a multi-chip package 855. Each multi-chip package can, for example, be a substrate such as organic, ceramic, glass, silicon, and the like. To this end, the multi-chip package 854 can be connected to the substrate 852 using interconnections 856. The interconnections 856 include a combination of MFIs and bumps, but one or the other can also be used. The multi-chip package 855 can be connected to the bridge chip 853 using interconnections 857. The interconnections 857 include a combination of MFIs and bumps, but one or the other can also be used. The multi-chip package 855 can be connected to the substrate 852 using bumps 858. Alternatively, the interconnections 858 include a combination of different MFIs, as well as bumps. The multi-chip package 855 can be connected to the bridge chip 853 using interconnections 859. The interconnections 859 include a combination of MFIs and bumps, but one or the other can also be used. The bridge configuration can be used, for example, to improve circuit or interconnect density. Since the wiring density on a PWB, such as the substrate 852, is usually limited (low density), one can improve the wiring density between multi-chip package 855 and multi-chip package 854 using the bridge chip 853. To this end, MFIs of multiple heights and geometries can be used, and these MFIs can further be used in conjunction with bumps of various sizes.

Figure 9:
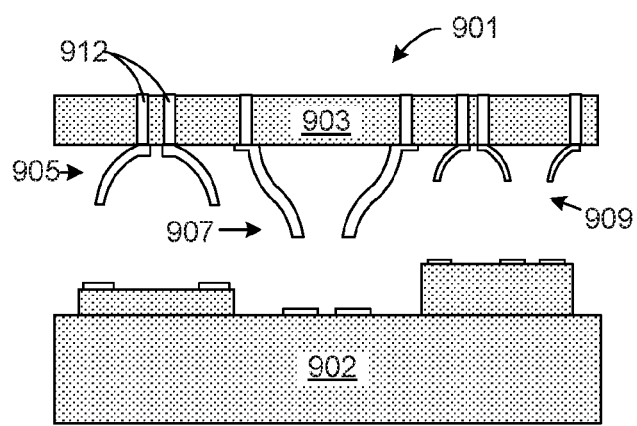
FIG. 9 illustrates a cross-sectional view of a testing interface or assembly incorporating mechanically flexible interconnects according to a representational embodiment.

FIG. 9 illustrates a testing interface 901 incorporating MFIs for testing or probing of an integrated circuit 902. The testing interface 901 is shown elevated above the integrated circuit 902. The testing interface 902 has a variety of MFIs 905, 907 and 909, having various geometries such as differing shapes and/or sizes, etc. While differing in geometry, the MFIs 905, 907 and 909 can all be designed to have similar compliance using the principles disclosed herein. Vias 912 can be used to provide connectivity to the opposite side of the testing interface 901 from the MFIs 905, 907, and 909.

The MFIs 905, 907, and 909 are designed to make contact with contact pads at various elevations on the integrated circuit 902, when the testing interface 901 is lowered towards the integrated circuit 902. While the MFIs shown in FIGS. 8A-8F and FIG. 9 have a certain basic geometry as shown, this is merely for illustrative purposes. Other geometries, for example, any of the features shown in FIG. 1E, as well as additional geometries, can be produced using the principles disclosed herein. Moreover, the various geometries can have a wide variety of top views designed for each, as described herein. While seen as individual MFIs in profile, any of the MFIs in FIGS. 8A-8E and FIG. 9 can represent a plurality of MFIs in depth, for example, in a row. There can also be additional MFIs produced at multiple orientations from a top view, for example, at different orientations around a chip, or at a specific orientation to allow for connectivity, etc.

It should be noted that ratios, concentrations, amounts, dimensions, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figures of the numerical value. In addition, the phrase "about 'x' to 'y'" includes "about 'x' to about 'y'".

As used herein, the terms "similar compliance" and "substantially equivalent compliance" can refer to compliance that differs about 30% or less, about 25% or less, about 20% or less, about 15% or less, about 10% or less, or about 5% or less. As used herein, the terms "similar contacting force" and "substantially equivalent contacting force" can refer to contacting force that differs about 30% or less, about 25% or less, about 20% or less, about 15% or less, about 10% or less, or about 5% or less. The term "or less" can extend to 0 or to 0.01.

As used herein, the terms "testing interface," "probing interface," "testing assembly," and "probing assembly" can refer to circuits or substrates configured for testing and/or probing another circuit. The other circuit can include integrated circuits. The "testing interface" or "probing interface" can be configured to be temporarily connected to the other circuit for testing or probing purposes, and can comprise or be connected to metering equipment, measuring equipment, and other testing equipment and instruments.

It should be emphasized that the above-described embodiments of the present disclosure are merely possible examples of implementations, and are set forth only for a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure.

Therefore, the following is claimed:

1. A substrate, comprising:
   a first mechanically flexible interconnect (MFI) on a surface of the substrate, the first MFI having a first geometry comprising a first height and a first thickness;
   a second MFI on the surface of the substrate, the second MFI having a second geometry comprising a second height and a second thickness; and
   wherein the first geometry and the second geometry are different, wherein the first MFI and the second MFI have a substantially equivalent compliance, and wherein the first geometry comprises a vertical curve convex to the surface of the substrate.

2. The substrate of claim 1, wherein the first height and the second height are different.

3. The substrate of claim 1, wherein the first thickness and the second thickness are different.

4. The substrate of claim 1, wherein the first geometry of the first MFI further comprises a vertical curve concave to the surface of the substrate.

5. The substrate of claim 1, wherein a respective one of the first geometry and the second geometry comprises a respective vertical curve convex to the surface of the substrate.

6. The substrate of claim 1, wherein the first geometry of the first MFI extends substantially vertically from the surface of the substrate for a distance, and wherein the vertical curve is between the distance and the first height.

7. The substrate of claim 1, wherein the first geometry of the first MFI has a first angle with respect to the surface of the substrate, and wherein the second geometry of the second MFI has a second angle with respect to the surface of the substrate, and wherein the first angle and the second angle are different.

8. The substrate of claim 1, further comprising a bump formed on at least one of a tip of the first MFI or a contact pad of the first MFI that is on a surface of substrate.

9. The substrate of claim 1, further comprising at least one passive circuit component that is elevated above the surface of the substrate.

10. An apparatus, comprising:
    at least one mechanically flexible interconnect (MFI) on a surface of a substrate, wherein the at least one MFI comprises a section that is curved convex to the surface of the substrate, the at least one MFI comprising a first MFI and a second MFI, the first MFI having a first geometry comprising a first height and a first thickness, the second MFI having a second geometry comprising a second height and a second thickness, wherein the first geometry and the second geometry are different, wherein the first MFI and the second MFI have a substantially equivalent compliance.

11. The apparatus of claim 10, wherein the section that is curved convex to the surface of the substrate is a first section of the at least one MFI, and the at least one MFI further comprises a second section that is attached to a lower end of the first section of the at least one MFI and the surface of the substrate.

12. The apparatus of claim 11, wherein the second section is substantially straight and substantially perpendicular to the surface of the substrate.

13. The apparatus of claim 11, wherein a respective one of the first geometry and the second geometry comprises a respective vertical curve convex to the surface of the substrate.

14. The apparatus of claim 10, wherein a first height of the first MFI is different from a second height of the second MFI.

15. The apparatus of claim 10, wherein a first thickness of the first MFI is different from a second thickness of the second MFI.

16. The apparatus of claim 10, wherein a first angle of the first MFI with respect to the surface of the substrate is different from a second angle of the second MFI with respect to the surface of the substrate.

17. The apparatus of claim 10, wherein the at least one MFI further comprises a tip section that extends substantially parallel to the surface of the substrate at a first height above the substrate.

18. The apparatus of claim 10, wherein the at least one MFI further comprises a base section that extends substantially vertically from the surface of the substrate for a distance, and wherein the section that is curved convex to the surface of the substrate is above the base section.

19. The apparatus of claim 10, further comprising a bump formed on at least one of a tip of the at least one MFI or a contact pad of the at least one MFI.

20. The apparatus of claim 10, further comprising at least one passive circuit component that is elevated above the surface of the substrate by the at least one MFI.

* * * * *